United States Patent
Challa et al.

(10) Patent No.: US 6,453,181 B1
(45) Date of Patent: Sep. 17, 2002

(54) METHOD AND APPARATUS FOR COMPENSATING FOR FREQUENCY DRIFT IN A LOW FREQUENCY SLEEP CLOCK WITHIN A MOBILE STATION OPERATING IN A SLOTTED PAGING MODE

(75) Inventors: Raghu Challa; Ihab Barghouti; Dung Nguyen, all of San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 0 days.

(21) Appl. No.: 09/434,865

(22) Filed: Nov. 4, 1999

(51) Int. Cl.$^7$ ................................................ H04B 7/00
(52) U.S. Cl. ...................................... 455/574; 455/343
(58) Field of Search ................................. 455/550, 572, 455/573, 574, 575, 343; 340/825.44; 370/310, 311

(56) References Cited

U.S. PATENT DOCUMENTS

| | | | | |
|---|---|---|---|---|
| 5,392,287 A | * | 2/1995 | Tiedemann, Jr. et al. | ... 455/343 |
| 6,016,312 A | | 1/2000 | Storm et al. | ................. 370/311 |
| 6,088,602 A | | 7/2000 | Banister | ...................... 455/574 |
| 6,212,398 B1 | * | 4/2001 | Roberts et al. | ............. 455/343 |

FOREIGN PATENT DOCUMENTS

| | | | | |
|---|---|---|---|---|
| DE | 0012635 | 3/2000 | ............ | H04Q/7/32 |
| EP | 0924947 | 6/1999 | ............ | H04Q/7/32 |

\* cited by examiner

*Primary Examiner*—Thanh Cong Le
(74) *Attorney, Agent, or Firm*—Philip R. Wadsworth; Charles D. Brown; Howard Seo

(57) ABSTRACT

A method and apparatus is described for tracking the length of a sleep period within a mobile station using a sleep clock to precisely calibrate portions of the sleep period. The sleep period subdivided into a sequence of sub-periods each of known duration wherein the durations of the sub-periods are not necessarily integer multiples of cycles of the sleep clock. Elapsed time is tracked within each individual sub-period of the sleep period using an integer sleep counter which tracks whole cycles of the sleep clock. Then any remaining fractional portions of the cycles of the sleep mode clock not accounted for by the integer sleep counter are tracked using a fractional sleep counter. The fractional sleep counter accumulates remaining fractional portions of sleep mode cycles from one sub-period to the next. A method and apparatus is also described for estimating frequency drift with a sleep clock signal used during a slotted paging mode of operation of a wireless mobile station. An initial frequency of the sleep clock signal is determined following power-up of the mobile station. A fixed frequency drift compensation factor representative of a difference between the initial frequency of the sleep clock signal and a predetermined nominal frequency is then determined. A dynamic frequency error compensation factor representative of a difference between the initial frequency and a current frequency of the slow clock signal is estimated. Then, throughout the slotted mode of operation, new values for the dynamic frequency compensation factor are iteratively determined by using a loop filter.

45 Claims, 6 Drawing Sheets

METHOD AND APPARATUS FOR COMPENSATING FOR FREQUENCY DRIFT IN A LOW FREQUENCY SLEEP CLOCK WITHIN A MOBILE STATION OPERATING IN A SLOTTED PAGING MODE

BACKGROUND OF THE INVENTION

I. Field of the Invention

The invention generally relates to mobile communication systems and in particular to techniques for compensating for frequency drift in a low frequency clock employed during a sleep period between paging slots within a mobile station of a mobile communications system.

II. Description of the Related Art

Certain state of the art wireless communication systems, such as Code Division Multiple Access (CDMA) Systems, employ slotted paging to allow mobile stations to conserve battery power. In a slotted paging system, paging signals are transmitted from a base station to particular mobile stations only within assigned paging slots separated by predetermined intervals of time. Accordingly, each individual mobile station may remain within a sleep mode during the period of time between consecutive paging slots without risk of missed paging signals. Whether any particular mobile station may switch from an active-mode to a sleep mode depends, however, upon whether the mobile station is currently engaged in any user activity such as processing input commands entered by the user or processing a telephonic communication on behalf of the user. Assuming though that the mobile station is not currently engaged in any processing on behalf of the user, the mobile station automatically powers down selected internal components during each period of time between consecutive slots. One example of a slotted paging system is disclosed in U.S. Pat. No. 5,392, 287, entitled "Apparatus and Method for Reducing Power Consumption in a Mobile Receiver", issued Feb. 21, 1995, assigned to the assignee of the present invention and incorporated by reference herein.

Thus, within a slotted paging system, a mobile station reduces power consumption by disconnecting power from selected internal components during a sleep period between consecutive slots. However, even during the sleep period, the mobile station must reliably track the amount of elapsed time to determine when the next slot occurs to permit receive components of the mobile station to power up in time to receive any paging signals transmitted within the slot. One solution to this problem is to operate a high frequency clock throughout the sleep period and to track the amount of elapsed time using the high frequency clock. This solution allows the sleep period to be very precisely tracked using the high frequency clock. However, considerable power is consumed operating the high frequency clock and optimal power savings therefore are not achieved during the sleep period.

Hence, it would be desirable to instead employ an alternate low frequency, low power clock during the sleep period to further reduce power consumption. However, low frequency, low power clock signals typically suffer from considerable frequency drift such that the amount of elapsed time during the sleep period cannot be precisely determined. Frequency drift within a mobile station can be particularly significant as a result of temperature variations within the mobile station either as a result of changes in operation of components of the mobile station or as a result of ambient conditions of the mobile station. For example, during an extended telephone call, components of the mobile station may heat to 87 degrees Celsius. During an extended period of inactivity, the temperature of the components may cool to an ambient temperature of, perhaps, 25 degrees Celsius. Moreover, if the user places the mobile telephone in either a very hot or very cold location, the temperature change may be even more significant. Typical low power, low frequency clock signal generators are significantly affected by even relatively minor temperature changes and are even more strongly affected by such broad changes in temperature. Indeed, the amount of drift in a typical low power, low frequency clock signal is sufficiently great such that if used by itself to calculate the elapsed time, there is significant risk that the mobile station will not be reactivated in time to power up components to detect a paging signal transmitted within a next paging slot. Accordingly, important paging signals maybe missed possibly resulting in missed phone calls and the like.

Hence, when using a low-frequency clock signal to track time during a sleep period, the mobile station is typically configured to return to an active mode by activating a high frequency clock signal well in advance of a next expected paging slot to thereby avoid possible timing errors. Thus, for example, if the paging slots occur every 26.67 milliseconds, the mobile station may be programmed to activate the high frequency clock and to power up receive components after only, for example, 26 milliseconds of sleep to ensure that the next paging slot is not missed. Hence, optimal power savings are not achieved.

One technique that has been proposed for compensating for timing errors inherent in low frequency, low power clock signal generators is to adapt a length of a current sleep period based upon a timing accuracy of a previous sleep period. More specifically, if a previous sleep period was determined to be too long due to timing errors in the low power, low frequency clock generator, the mobile station is programmed to wake up earlier in the current sleep period. To determine whether a sleep period is too long or too short, the mobile station attempts to detect a unique word within a received paging signal, such as a message preamble which signifies the beginning of an assigned slot. If the unique word is not detected, the mobile station concludes that it woke up too late and therefore the sleep duration is decreased for subsequent sleep periods. If the unique word was properly received, the mobile station either woke up on time or wake up too early and the sleep duration is increased slightly for the subsequent sleep period. One problem with the aforementioned technique is that it assumes that any failure to detect the unique word is a result of a timing error. However, there may be other reasons besides the duration of the sleep period that the unique word was not correctly received and demodulated, such as poor communication channel quality conditions. Moreover, even if failure to detect the unique word was a result of a timing error rather than other communication errors, the system still does not precisely correct for errors in the low power, low frequency clock signal and therefore does not provide for optimal power savings.

A significant improvement is provided in U.S. patent application Ser. No. 09/134,808, entitled "Synchronization of a Low Power Oscillator with a Reference Oscillator in a Wireless Communication Device Utilizing Slotted Paging", filed Aug. 14, 1998 and assigned to the assignee of the present invention. In the aforementioned patent application, timing errors are corrected without relying upon the failure to receive portions of transmitted signals. Rather, the system includes a frequency error estimation unit for directly estimating the frequency of the low power, low frequency clock.

In one example described in the patent application, the frequency error in the low frequency clock is determined by timing the low frequency clock using a high frequency clock during periods of time when the high frequency clock is active. For example, during each paging slot when the high frequency clock signal of the mobile station is activated, the frequency error in the low frequency clock is calculated based upon the high frequency clock. Additionally, the system operates to synchronize the activation of the high frequency clock very precisely to transitions in the low frequency clock signal to further reduce errors.

Although the system of the aforementioned patent application provides a significant improvement over systems which rely on the detection of unique words of signals transmitted to the mobile station, considerable room for improvement remains. To permit the mobile station to respond promptly to any keys that have been pressed by a user during a sleep period, it is often desirable to subdivide the sleep period into a sequence of sub-periods, also referred to herein as "catnaps". After each catnap, selected components of the mobile station are powered up sufficiently to detect whether a key on the keypad has been pressed and, if so, the sleep period is aborted and other components of the mobile station are powered up as needed to respond to the pressed key. The duration of the catnaps are typically not an interger number of cycles of the low frequency sleep mode clock. Accordingly, considerable truncation errors can occur if the low frequency clock, by itself, is employed to time the catnaps. Hence, it would be desirable to provide a system for timing sleep periods using a low frequency clock in such a manner to eliminate substantial truncation errors and aspects of the invention are directed to this end. Also, because the frequency error is calculated only while the mobile station is in an active-mode, it may not properly detect frequency errors occurring during extended sleep periods during which time the temperature of the low frequency clock signal generator decreases significantly. Accordingly, even with the improved system of the patent application, the high frequency clock signal must be usually be activated somewhat in advance of the next expected paging slot to account for remaining timing errors. Hence, optimal power savings are not achieved. It would be also preferable to provide a system wherein frequency drift is estimated effectively to permit an active mode high frequency clock to be turned on as close as possible to the next paging slot to permit maximum power savings during the sleep period and to permit easy reacquisition of a paging signal and it is to these ends that other aspects of the present invention are also directed.

SUMMARY OF THE INVENTION

In accordance with a first aspect of the invention, a method is provided for tracking the length of a sleep period within a mobile station using a sleep clock. The method operates to precisely calibrate portions of the sleep period. In accordance with the method, a sleep period is initiated with the sleep period subdivided into a sequence of sub-periods each of known duration but wherein the durations of the sub-periods are not necessarily integer multiples of cycles of the sleep clock. Elapsed time is tracked within each individual sub-period of the sleep period using an integer sleep counter which tracks whole cycles of the sleep clock. Any remaining fractional portions of the cycles of the sleep mode clock not accounted for by the integer sleep counter are tracked using a fractional sleep counter, with the fractional sleep counter accumulating remaining fractional portions of sleep clock cycles from one sub-period to the next.

In an exemplary embodiment of the first aspect of the invention, the sub-periods of the sleep period are "catnaps". Within each catnap, the integer sleep counter is incremented downwardly on each cycle of the sleep clock. When the integer sleep counter reaches 0, the catnap is deemed to be complete. When the catnap is complete, a keypad of the mobile station is checked to determine whether a key has been pressed and, if so, the sleep period is terminated. Whenever the fractional counter overflows, a current value of the integer sleep counter is increased by a integer overflow portion of the fractional sleep counter such that the integer counter then accounts for the overflow. A current value of the fractional sleep counter is reset to be equal only to the remaining fractional portion, if any, of the previous fractional sleep counter value such that the fractional sleep counter continues to track remaining fractional portions of cycles of the sleep mode clock.

In accordance with a second aspect of the invention, a method is provided for compensating for frequency drift within a sleep clock signal used to time sleep periods during a slotted paging mode of operation of a wireless mobile station wherein the wireless mobile station receives signals from a base station having high timing accuracy. The method operates to iteratively adjust an estimate of the frequency drift during a sleep mode to enable effective frequency drift compensation. In accordance with the method, an initial frequency of the sleep clock signal is determined following power-up of the mobile station. A fixed frequency drift compensation factor representative of a difference between the initial frequency of the sleep clock signal and a predetermined nominal frequency (that eliminates truncation error) is then determined for computational convenience. A dynamic frequency error compensation factor representative of a difference between the initial frequency and a current dynamic frequency of the slow clock signal (which may vary due to temperature or aging) is estimated. Then, during the slotted mode of operation, the following steps are iteratively performed. The dynamic frequency error compensation factor is updated by determining an amount of timing slew between the mobile station and the base station, and then determining new values for the dynamic frequency compensation factor by applying a value representative of the amount of the slew to a feedback loop configured to provide a new dynamic frequency error compensation factor having a value selected to achieve a subsequent reduction in slew.

In an exemplary implementation, the sleep period length is converted into the number of sleep clocks using the dynamic frequency as the initial estimate. After each wakeup from a sleep period, the mobile station searches for an incoming signal from the base station. As timing is maintained at the base station with very high accuracy, any error made in the initial estimate of dynamic frequency (arising due to truncation effects or temperature-and aging-induced frequency drifts) will show up as a "slew" in the timing of the incoming signal. The quantity "slew" indicates the timing difference or offset that the mobile perceives after wakeup from sleep. Then a new value for the dynamic frequency compensation factor is determined by applying a value representative of the amount of the slew to a loop filter.

In a preferred implementation, the mobile station is configured to implement both the improved calibration method and the improved frequency drift estimation method. Apparatus embodiments of the invention are also provided.

BRIEF DESCRIPTION OF THE DRAWINGS

The features, objects, and advantages of the invention will become more apparent from the detailed description set forth below when taken in conjunction with the drawings in which like reference characters identify correspondingly throughout and wherein.

DETAILED DESCRIPTION OF THE PREFERRED EMBODIMENTS

Referring to the figures, an exemplary embodiment of the invention will now be described. Initially, a method by which the exemplary embodiment operates to time a sleep period using a sleep-mode clock and to calibrate the end of the sleep period precisely with a next paging slot will be described with reference to FIGS. 1–3. The method operates to precisely calibrate the length of the sleep period despite frequency drift which may occur during the sleep period. Then, a method by which the exemplary embodiment operates to estimate the frequency drift will be described with reference to the remaining figures.

Figure 1:
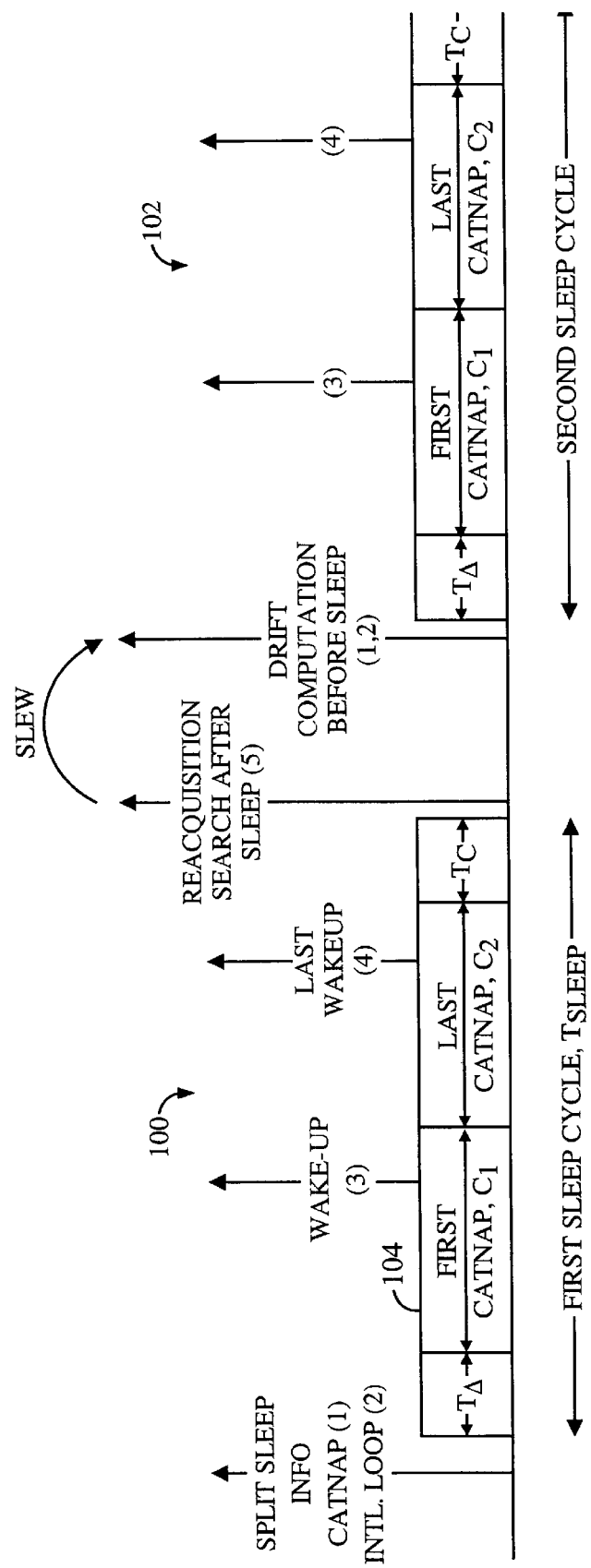
FIG. 1 is a timing diagram illustrating a pair of consecutive sleep periods, each including one or more catnap periods, tracked in accordance with an exemplary method of the invention.

FIG. 1 is a timing diagram illustrating a pair of consecutive sleep periods 100 and 102 each subdivided into a set of sub-periods or "catnaps" generally denoted by reference numeral 104. During a period of time between each catnap, the mobile station wakes up only those components necessary to determine whether a key has been pressed on the key pad. In the example of FIG. 1, each sleep period includes only two catnaps. In other implementations a different number of catnaps may be employed. Each sleep period is timed primarily using only a sleep-mode clock having a relatively slow frequency, such as a 32 kilohertz clock. As will be described, a transition-mode clock having a substantially higher frequency than the sleep-mode clock is employed at the beginning and end of the sleep period to help calibrate the length of the sleep period. The length of the sleep period is not necessarily an integer number of cycles of the sleep clock. Likewise, the lengths of individual catnaps are not necessarily integer multiples of the sleep clock. To account for fractional portions of the sleep-mode clock, a fractional counter is employed. Also, the complete set of catnaps within the sleep period does not account for the entire period of time within the sleep period. Rather, an initial period of time $T_a$ occurs prior to the start of the first catnap and a final period of time $T_c$ occurs between the end of the last catnap and the end of the sleep period. The initial period $T_a$ occurs because of the first catnap does not begin until a first edge of the sleep-mode clock is detected and the first edge with may be offset from the start of the sleep period. The final time period $T_c$ is provided to permit the system to precisely calibrate the termination of the sleep period with a next paging slot by taking into account the fractional portions of sleep cycles counted using the fractional counter.

Figure 2:
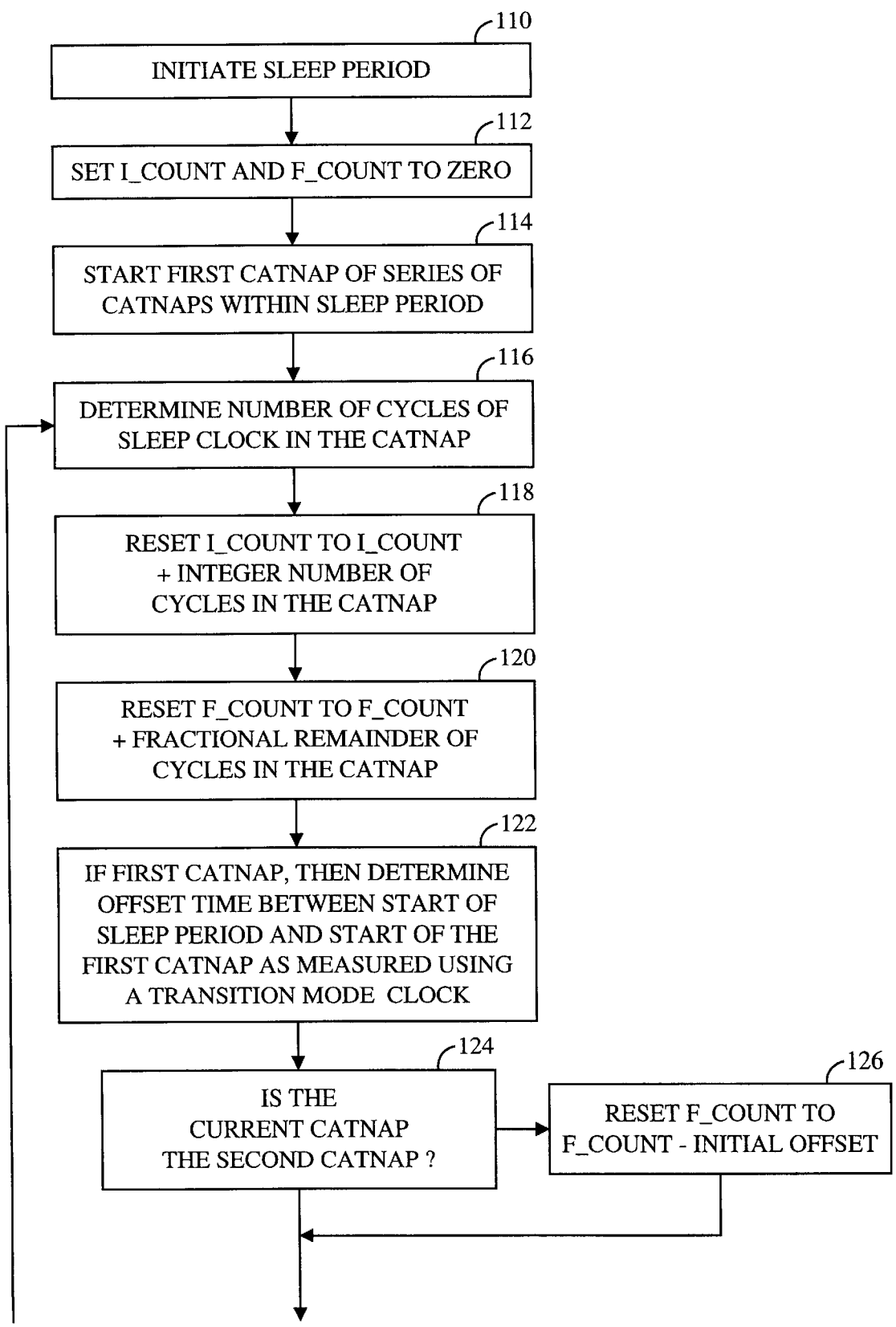
FIG. 2 is a flow chart illustrating the exemplary method of the invention.
Figure 2:
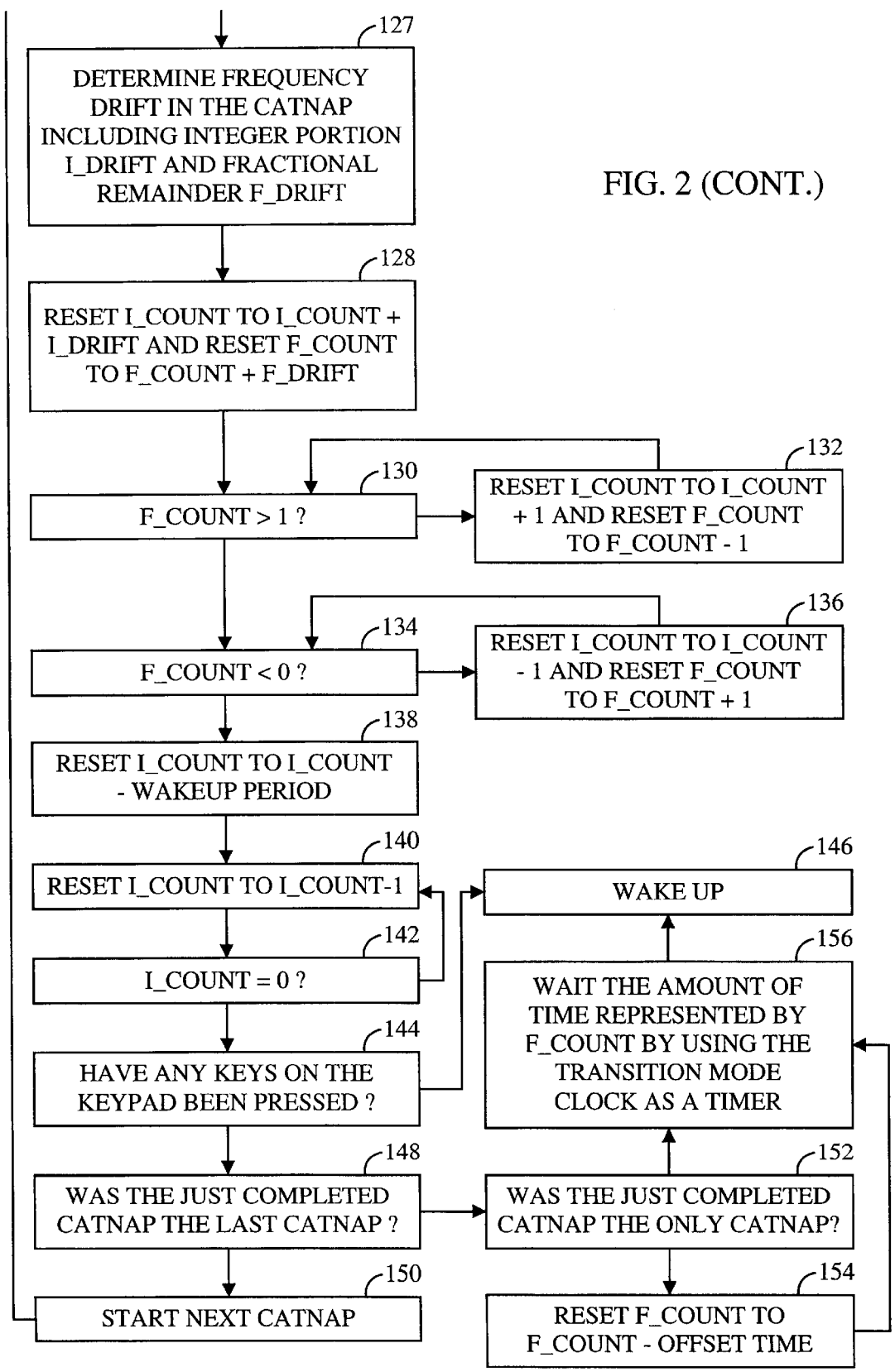

Referring now to FIG. 2, the method by which the mobile station determines the lengths of various catnaps and determines the amount of time $T_c$ necessary to precisely terminate the end of the sleep period with the next paging slot will now be described. The mobile station initiates the sleep period at step 110. At step 112, the integer counter (I_COUNTER) and the fractional counter (F_COUNT) are both set to 0. Then, at step 114, the first of a series of catnaps is initiated. The first catnap commences with a falling edge following the first detected rising edge of the sleep-mode clock which, as noted above, may be offset from the start time of the sleep period by an initial offset time $T_a$.

At step 116, the mobile station determines the number of cycles of the sleep clock within the current catnap based upon the length of the catnap. The length of the catnap is predetermined and values representative of the length may be stored in appropriate memory registers. Then, at step 118, the integer counter is reset to equal the previous value of the integer counter plus the integer number of cycles in the current catnap. Prior to the first execution of step 118, the integer counter is set to 0. Hence, following step 118, the integer counter is simply set to the number of whole cycles of the sleep clock occurring during the first catnap. At step 120, the fractional counter is set to equal the previous value of the fractional counter plus any fractional remainder of the cycles of the sleep mode clock in the catnap. Again, prior to the first execution of step 120, the fractional counter is initially set to 0 and hence, following step 120, the fractional counter is simply set to the fractional number of cycles remaining in the first catnap not accounted for by the integer number of cycles stored within the integer counter.

At step 122, if the current catnap is the first catnap, then the offset time $T_a$ between the start of the sleep period and the start of the first catnap is determined. In the preferred implementation, the duration of the offset time is determined by activating a high frequency transition-mode clock prior to the commencement of the sleep period, then counting the number of cycles in the transition-mode clock occurring between the start of the sleep period and the start of the first catnap. Further details regarding the transition-mode clock are provided in a co-pending U.S. Patent Application entitled "Method and Apparatus for Activating a High Frequency Clock Following a Sleep Mode within a Mobile Station Operating in a Slotted Paging Mode", filed contemporaneously herewith, assigned to the assignee of the present application, and incorporated by reference herein.

At step 124, the mobile station then determines whether the current catnap is the second capnap and if so operates to subtract the initial offset time $T_a$ from the current value of the fractional counter in step 126. Hence, during a second catnap, the mobile station resets the fractional counter to compensate for the initial offset time. Continuing, though, with processing occurring during of the first catnap, execution proceeds directly from step 124 to step 126 wherein the mobile station determines the frequency drift in the first catnap. The manner by which the frequency drift is estimated will be described below.

The estimate of the frequency drift includes both an integer portion (I_DRIFT) and a fractional remainder portion (F_DRIFT). The integer portion represents the amount of frequency drift occurring within the catnap in whole cycles of the sleep-mode clock. The amount of frequency drift will not likely be precisely equal to an integer number of the sleep mode clock cycles. Any fractional remainder is represented by F_DRIFT. At step 128, the mobile station adds I_DRIFT to I_COUNT and also adds F_DRIFT to F_COUNT to thereby account for both the integer and fractional portions of the frequency drift. Following step 128, it is possible that the fractional counter will be greater than 1. Such may occur, for example, if the total of the fractional portion of the frequency drift determined at step 126 and the fractional portion of the duration of the catnap determined at step 120 collectively exceed one complete cycle of the sleep mode clock. To ensure that the fractional counter remains between 0 and 1.0, the mobile station determines, at step 130, whether the F_COUNT is greater than 1 and, if so, step 132 is performed wherein the integer counter is incremented by 1 and the fractional counter is decremented by 1. Following step 132, execution returns to step 130 wherein the mobile station again determines whether the fractional counter is greater than 1.0 and, if so, step 132 is repeated. In this manner, steps 130 and 132 are repeated in a loop until the fractional counter is reset to a value between 0 and 1.0.

On the other hand, following step 128, it is possible that the fractional counter will be less than 0. Such may occur if the frequency drift value is a negative value and is larger in magnitude than the fractional remainder determined at step 120. To ensure that the fractional counter remains between 0 and 1.0, the mobile station determines at step 134 whether F_COUNT is less than 0 and, if so, step 136 is performed wherein the integer counter is decremented by 1 and the fractional counter is incremented by 1. Following step 136, execution returns to step 134 wherein the mobile station determines whether the fractional counter is still negative and, if so, step 136 is repeated. In this manner, steps 134 and 136 are repeated in a loop until the fractional counter is reset to a value between 0 and 1.0.

At step 138, the mobile station accounts for any necessary wakeup time (or warm-up interval) required at the end of each catnap to allow the components of the mobile station to power up to detect whether any keys on the keypad have been pressed. Accordingly, at step 138, the mobile station determines the duration of the wakeup period in cycles of the sleep-mode clock then subtracts the wakeup period from the value currently held with an integer counter. The length of the wake up period is predetermined and values representative of the length may be stored in appropriate memory registers. Note that any fractional portion of the wakeup period is not separately accounted for. In other implementations, the wakeup period can be divided into an integer portion and a fractional portion with the fractional portion subtracted from the fractional counter as well.

Thus, following step 138, the integer counter contains a value indicating the number of cycles of the sleep-mode clock occurring between the beginning of the current catnap and the beginning of the wakeup period at the end of the catnap, adjusted, for example, to account for the frequency drift. Beginning at step 140, the mobile station times the catnap by subtracting 1 from the value of I_COUNT with each tick of the sleep-mode clock then, at step 142, checking to determine whether I_COUNT has reached 0. Once I_COUNT has reached 0, the point and time wherein components of the mobile station need to wakeup to facilitate any required processing at the end of the catnap has been reached. As step 144, the mobile station then begins waking up those components and, upon completion of the wakeup period, performs any necessary functions such as determining whether any of the keys on the key pad have been pressed. If any key has been pressed, or if the mobile station determines that any other processing is required, then the mobile station wakes up at step 146. Depending upon the implementation, this may involve powering up all remaining components of the mobile station or perhaps powering up only those components required to perform the particular required functions. In any case, the high-frequency clock is activated at step 146 and further sleep mode processing is terminated.

If, however, at step 144 the mobile station determines that no keys have been pressed and that no other action is required, then execution proceeds to step 148 wherein the mobile stations determines whether the just completed catnap was the last catnap of the sleep period. If not, then at step 150, the mobile station begins the next catnap causing execution to return to step 116 wherein the mobile station determines the number of cycles of the sleep clock within the new catnap and proceeds as described above.

In this manner, until either a key has been pressed or until the last catnap has been completed, the mobile station executes steps 116–150 in a continuous loop. Note that, although the integer counter I_COUNT will always be equal to 0 at the beginning of each catnap loop (i.e., at step 116) the fractional counter F_COUNT will typically not be equal to 0 at the beginning of any catnap other the first. Rather, the fractional counter will retain whatever previous fractional count was held therein. In this matter, the fractional counter accumulates fractional portions of sleep cycles from one catnap to the next.

Eventually the fractional counter will likely overflow, i.e., the fractional counter will at some point be set to a value greater than 1.0. If so, then during a first subsequent execution of step 130, the overflow is accounted for by incrementing I_COUNT by 1 and by decrementing F_COUNT by 1. In this manner, upon the completion of each catnap, the fractional counter will again be equal to some value between 0 and 1.0. Thus, only fractional remainders of sleep cycles are carried from one catnap to the next and all integer portions are accounted for within each individual catnap. In other words, the duration of each catnap is calibrated to be within at least one sleep cycle of the intended catnap length.

Eventually, at step 148, the mobile station will detect that the just completed catnap is the last catnap and, if so, execution proceeds to step 152 or in the mobile station begins to account for the remaining period of time $T_c$ necessary to wake up the receive components of the mobile station in time for the next paging slot. In some circumstances, only a single catnap will occur within the sleep period, hence the last catnap is also the first catnap. Such may occur, e.g., when the mobile station is woken up due to a key pad event occurring during the first catnap. Earlier it was noted that during a second catnap, at steps 124 and 126, the fractional counter is reset to account for the initial offset time $T_a$. However, if there is only a single catnap, step 126 will not have been executed. Accordingly, the mobile station determines, at step 152 whether the just completed catnap was the only catnap and, if so, step 154 is performed to subtract the initial offset time from the current value of the fractional counter. In either case, execution proceeds to step 126 wherein the mobile station then reactivates the transition mode clock to time the remaining amount of time specified by the fractional counter and, when that period has elapsed, the mobile station then wakes up at step 146.

Thus, FIG. 2 illustrates a method whereby the mobile station precisely calibrates the length of the overall sleep period to wake up receive components of the mobile station just in time to receive a paging signal, if any, provided within the next paging slot. Hence, the receive components remain powered down for the maximum possible duration to thereby gain the maximum amount of power savings during the sleep period. Precise calibration is achieved, in part, using the aforementioned fractional sleep counter which accumulates fractional portions of complete cycles of the sleep clock from one catnap to the next to permit those fractional portions to be ultimately accounted for prior to wakeup of the receive components.

In the following, a specific example is described for use within a mobile station configured in accordance with IS-95A standard. According to the IS-95A standard, a CDMA mobile station or "subscriber station" operating in a slotted mode maximizes the standby time by going to sleep, based on a parameter, Slot Cycle Index (SCI). The subscriber station wakes up every ($1.28*2^{SCI}$) sec to monitor its assigned 80 ms slot to receive pages. For example with SCI=0, the subscriber station ideally remains awake for 80 ms and sleeps for 1.2 sec. As noted above, the station must wake up a sufficient amount of time ahead of the next slot boundary so as to take care of events such as radio frequency (RF) component warm-up, synthesizer stabilization, clock settling, CDMA pilot search and acquisition, finger reassignment and decoder warm-up.

Figure 3:
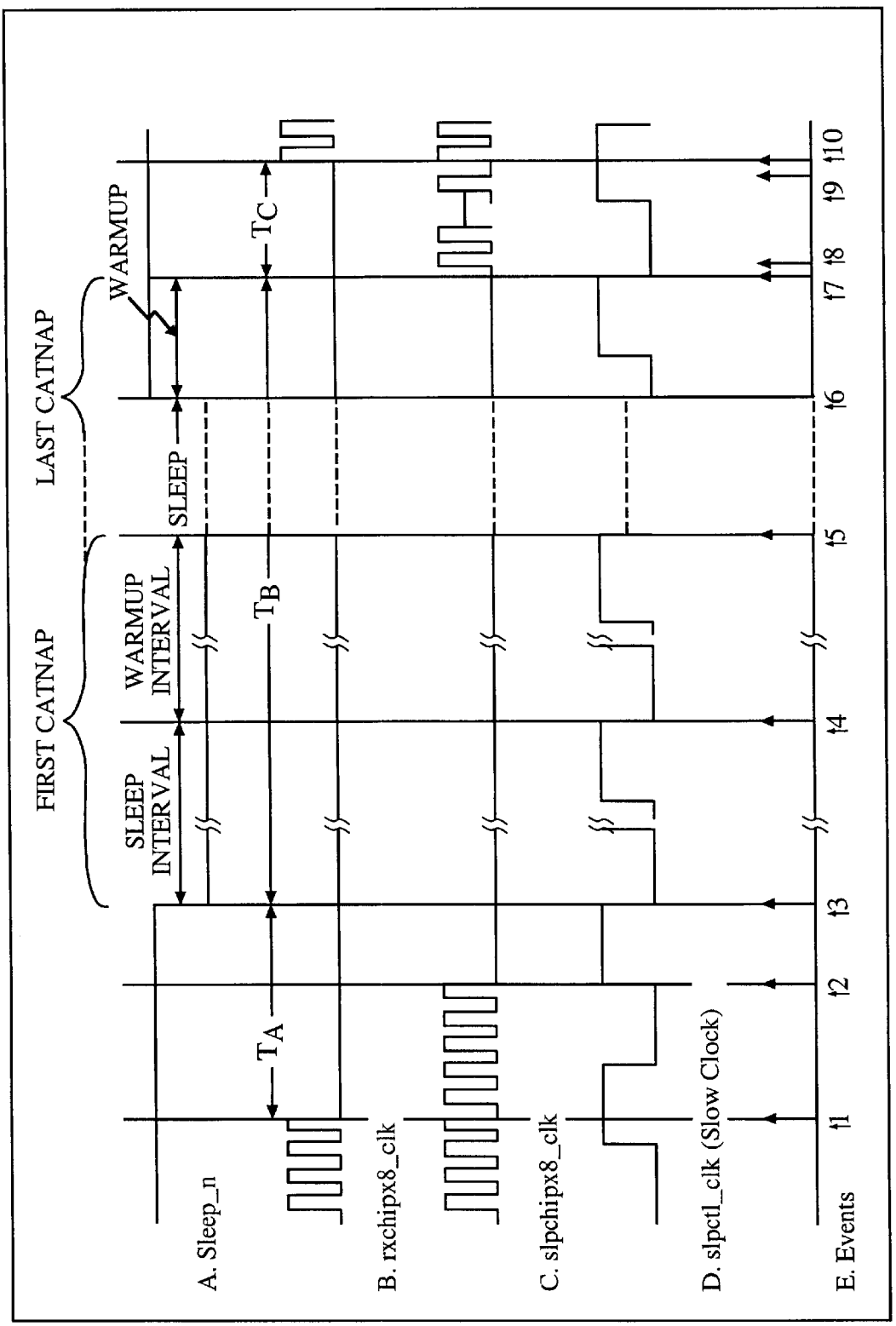
FIG. 3 is a timing diagram illustrating various clock signals utilized by the exemplary method of FIG. 2.

As shown in FIG. 3, in each sleep cycle the unit sleeps in catnaps to allow good response time if the user presses a key while it is asleep. The sleep cycle length and catnap length are chosen to be multiples of a psuedorandom number period $T_{PN}$ (also known as PN roll) so that upon wake-up, pilot may easily be found. $T_{PN}$ may be, for example, 26.67 milliseconds. Each catnap is further divided into: (1) "sleep time," when the entire unit is put to sleep and (2) "warm-up time," when the RF and analog units are turned on for warm-up. When the subscriber station is asleep, the system time is approximately maintained by clocking the counters that keep track of sleep duration with a combination of the sleep clock for coarse timing (maximum resolution of 1/60 k=16.7 micro-sec) and the transition mode clock (SLPCHIPX8) for fine timing (resolution of $1/(8*1.2288e6)=0.102$ micro-sec).

An example of the events that constitute a sleep cycle is shown in FIG. 3. Waveform E within the figure marks each event in the sleep cycle as follows:

Before t1: When it is time to sleep, the software shuts off all unnecessary clock regimes except for the CDMA demodulator and a decoder clock regime, RXCHIPX8 (Waveform B).

A catnap (which is a multiple of 26.67 ms) is split into sleep time and warm-up time and programmed as the duration of the first catnap interval through the SLEEP_INTERVAL and WU_TIME registers.

Software writes an ASIC_SLEEP_ARM bit of a SLEEP_CTL register, indicating that subscriber station must go to sleep on the next PN roll (indicated by t1).

All along, the sleep clock (Waveform D) runs asynchronous to a high frequency CDMA clock regime CHIPX8, while the SLPCHIPX8 (Wave-form C) is in sync with the RXCHIPX8, having been derived from the same source, CHIP8.

At time t1: when a PN roll occurs, the RXCHIPX8 clock regime is disabled putting the subscriber station to sleep. It is from this point onwards that it is desirable for the sleep period to be very close to multiples of 26.67 ms using counters SLEEP_INTERVAL and WU_TIME running off the sleep clock. To account for the asynchronous sleep clock, a transition-mode counter called CHIPX8_SLEEP_TIME starts counting the SLPCHIPX8's that have elapsed from t1 to the next rising edge of the sleep clock.

At time t2: the rising edge of sleep clock occurs at which time the SLPCHIPX8 clock regime is disabled, freezing the CHIPX8_SLEEP_TIME, there by providing an estimate of the time duration (t2−t1) in chipx8 units.

At time t3: after half a sleep clock duration, a SLEEP_N signal (Waveform A) goes low on the falling edge of the sleep clock causing the other digital, analog and RF components in the phone to transition to a low power mode. If there are $N_{SC}$ chipx8's in a sleep clock cycle, the total time elapsed at this point of time is given by: $T_A=(t2-t1)+(t3-t2)=\{CHIPX8\_SLEEP\_TIME +\_N_{SC}\}$ chipx8s. It may be noted that from this definition, $T_A$ will be in the range of __−1__ slow clock cycles. Subsequent catnaps are adjusted to account for this extra time slept owing to the asynchronous sleep crystal. Also a counter SLEEP_INTERVAL running off the sleep clock starts to counts down.

At time t4: the counter SLEEP_INTERVAL asserts a wake-up interrupt when it reaches a zero count. The microprocessor wakes up sufficiently to determine if hardware needs to be awake at the next slot or to service a key-press event.

If neither of these conditions is met, the software ensures that hardware can remain asleep by keeping the SLEEP_N signal active during the warm-up count down (via the WU_TIME counter). At this time, the software estimates the number of sleep clocks needed to sleep in the next catnap based on several factors such as next catnap length, asynchronous lag in the slow clock, drift and truncation errors that arise from the use of sleep clock to approximate a multiple of PN roll. The exact calibration procedure was summarized above and is further detailed below.

At time t5: when the WU_TIME counter expires, a new value obtained in the previous step is loaded into the SLEEP_INTERVAL counter. The WU_TIME counter is a precomputed constant specified by a RF hardware warm-up requirements. The microprocessor goes back to sleep awaiting the wake-up interrupt from the next catnap.

At time t6: If however there are any pending interrupts to be serviced or if this is the last catnap allowed in this sleep cycle, the hardware is woken up to be ready for the next slot by causing the SLEEP_N pin to go inactive at the wake-up interrupt. While the WU_TIME counter counts down, the analog and RF components warm up.

At time t7: the WU_TIME counter expires indicating the end of the last catnap and the SLPCHIPX8 regime is turned on at time t8. As a side note, the total time elapsed during all the catnaps, denoted by $T_B$=t7-t3, will be close to integer multiple of sleep clocks. Due to the several factors mentioned previously that are used in the sleep calibration, there will usually be a residual amount of time (a fraction of sleep clock) for which the subscriber station needs to still remain asleep. This fractional sleep clock (denoted by $T_C$) is converted into chipx8 units and programmed into the CHIPX8_SLEEP_TIME that starts counting down clocked by the SLPCHIPX8.

At time t9: the CHIPX8_SLEEP_TIME expires, and the hardware turns on the RXCHIPX8 at time t10. The last time duration of interest is $T_C$=t9-t7.

Thus, one of the major goals of the calibration process is to ensure that the sleep cycle length $T_{SLEEP}=T_A+T_B+T_C$ be a multiple of 26.67 ms.

As mentioned earlier, the sleep crystal is a low frequency and inexpensive oscillator, and therefore may have high frequency errors (on the order of ±200 ppm) due to factors such as temperature, aging and part tolerance. To meet a strict real-time deadline that is stipulated in the sleep mechanism of the IS-95A standard, it is important to have a good up-to-date estimate of the frequency of sleep clock before putting the subscriber station to sleep. A "Frequency Error Estimation circuit" (FEE) is used to provide running estimates of the frequency of slow clock. The FEE is used in the calibration in the following two different, but related ways.

The effective frequency of the slow clock $F_{SC}$ lies in the 30–60 kHz range, the exact value of which is specified by the subscriber station manufacturer. It is convenient to make the calibration independent of the exact sleep clock, hence the FEE is initially used to estimate the frequency of the slow clock every time the subscriber station is powered up.

The basic principle underlying the FEE is to count the number of chipx8's (which is a very stable clock tracking the system timing) that have elapsed in a slow clock period. As an example, assume that the manufacturer has chosen an oscillator whose actual frequency is $F_{SC}^A$=32.76 KHz. Then, each sleep clock will have $N_{SC}^A$=300.073 chipx8's/sleep clock. In order to accommodate the fractional chipx8's of significance in the counting process, the FEE actually counts the number of chipx8's in $L^{FEE}$=255 sleep clocks. The FEE continuously provides the chipx8 count once every $L^{FEE}$ sleep clock's as long as the subscriber station is awake.

As the accuracy of FEE is limited to only 1 chipx8 in $L^{FEE}$ slow clocks, the resulting maximum quantization error is ≈1.44 Hz (24 ppm) at $F_{SC}^A$=60 kHz. In order to smooth out the quantization error, a moving average window filter (MAW) of length $L^{MAW}$=256 FEE samples is used, which provides estimates of $F_{SC}^A$ with near-zero quantization error. The filter length is a compromise between quantization error and response time. The advantage of using a MAW filter instead of integrate-and-dump type of averaging is that the MAW filter has a faster response for changes in the input frequency as it is updated with every FEE sample. Specifically, MAW provides one output every FEE output where as the integrate-and-dump filter gives one output every $L^{MAW}$ FEE samples. If $N_{FEE}^{MAW}$ is the output of the MAW filter operating on the FEE outputs, then the initial estimate of the sleep clock frequency at power-up can be computed as:

$$F_{SC}^A = F_{CX8} \leftarrow \rightarrow L^{FEE} \leftarrow \rightarrow L^{MAW}/N_{FEE}^{MAW} \text{ Hz}. \qquad \text{Eq. 1}$$

It is convenient to perform all the computations based on a constant nominal sleep clock frequency, rather than the variable $F_{SC}^A$. Hence, a nominal frequency is derived from the actual $F_{SC}^A$, such that:

$$F_{SC}^N = F_{SC}^A/75 \leftarrow \rightarrow 75 \text{ Hz} \qquad \text{Eq. 2}$$

is a multiple of 75. [X] and <X> respectively denote the integer and fractional portions of X. Because of this choice, the manufacturer specific frequency can deviate from the nominal frequency as much as $(F_{SC}^A - F_{SC}^N) < \pm 75/2$ Hz (±600 ppm) and still be mapped to the same nominal frequency.

The dynamic frequency of sleep crystal is herein denoted by $F_{SC}^D$. After the initial use of FEE to estimate $F_{SC}^A$, $F_{SC}^D$ is also used during the slotted operation to estimate the difference $(F_{SC}^D - F_{SC}^A)$ using the MAW. The computations performed using the nominal slow clock frequency $F_{SC}^N$ are adjusted to account for the errors (1) due to difference in nominal and actual slow clock frequencies $(F_{SC}^A - F_{SC}^N)$ and (2) due to temperature variations $(F_{SC}^D - F_{SC}^A)$, via two "drift compensations" defined as follows:

"Fixed Drift Compensation (FDC)" that adjusts for the fixed, known error $(F_{SC}^A - F_{SC}^N)$ incurred by using $F_{SC}^N$ instead of $F_{SC}^A$. The FDC needed per each PN roll can be shown to be equal to:

$$N_{FDC} = (1 - F_{SC}^N/F_{SC}^A) \leftarrow \rightarrow F_{CX8} \leftarrow \rightarrow T_{PN} \text{ chipx8s/PN roll} \qquad \text{Eq. 3}$$

"Dynamic Drift Compensation (DDC)" that accounts for the dynamically varying frequency deviation of $(F_{SC}^D - F_{SC}^A)$ is similarly given by:

$$N_{DDC} = (1 - F_{SC}^N/F_{SC}^D) \leftarrow \rightarrow F_{CX8} \leftarrow \rightarrow T_{PN} - N_{FDC} \text{ chipx8s/PN roll} \qquad \text{Eq. 4}$$

Under the assumption that the sleep crystal is operating at its nominal frequency of $F_{SC}^N$ Hz, there will be $F_{CX8}/F_{SC}^N$ chipx8's/nom_sleep clock. Then, the amount error incurred in chipx8's for each nominal sleep clock when the sleep crystal is in reality operating at $F_{SC}^A$ Hz is $$\left( \frac{1}{F_{SC}^A} - \frac{1}{F_{SC}^N} \right) \leftrightarrow F_{CX8} \text{chipx8's/nom\_sleep clock.}$$

Figure 4:
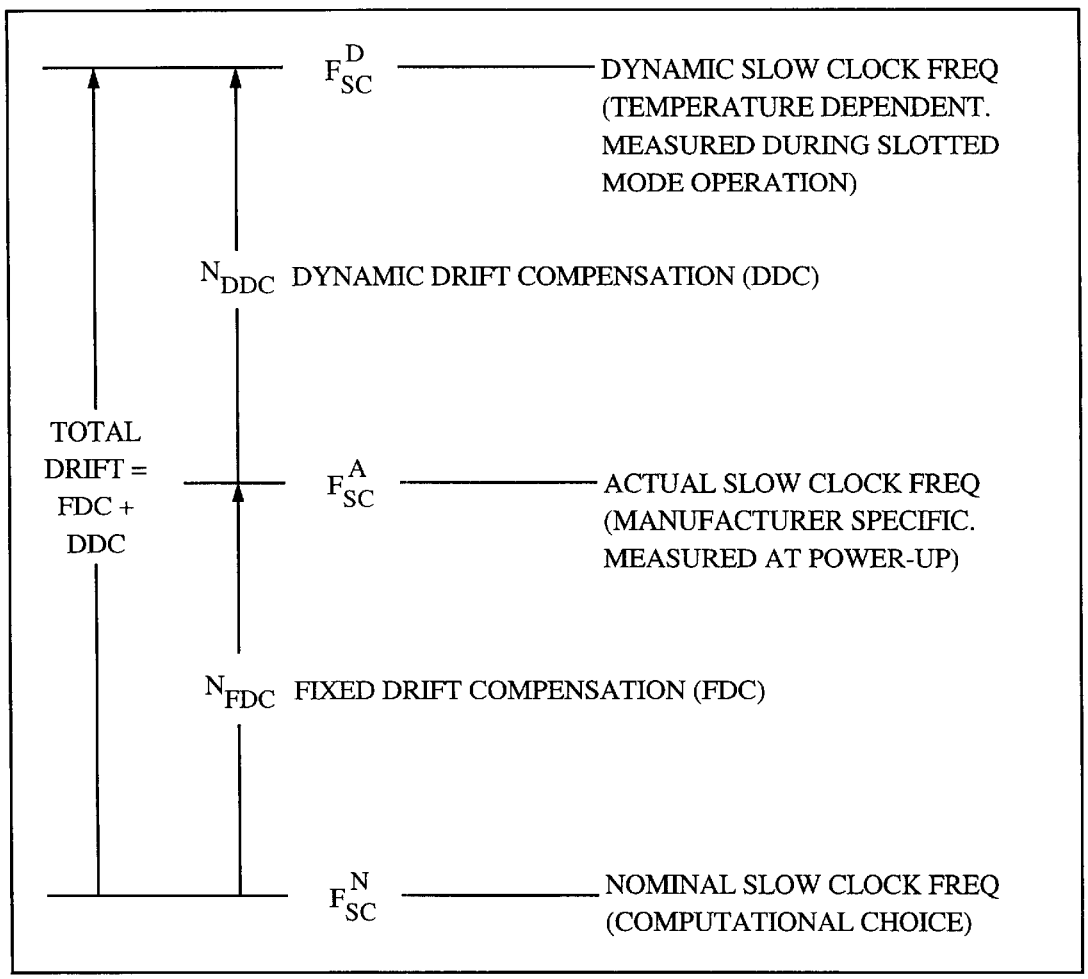
FIG. 4 is a vector diagram illustrating certain timing values processed by the method of FIG. 2.

The chipx8 error per PN roll or FDC of Eq. 3 is obtained by multiplying the preceding expression by: $F_{SC}^N$ nom_SC/sec $\leftarrow \rightarrow T_{PN}$ sec/PN roll. The relationship between the two drift compensations is shown in FIG. 4. The sum of DDC and FDC constitutes the total drift compensation needed to adjust the $F_{SC}^N$ based computations. Note that instead of these two separate drifts, a single "total drift" can be defined based directly on the difference of the dynamic and nominal frequencies $(F_{SC}^D - F_{SC}^N)$. However, the advantage of splitting the drift compensation is that the dynamic drift tends to have a small magnitude that can be filtered (if so desired) with out saturation and overflow problems.

At the beginning of each catnap, the catnap duration is rationed into (1) a maximum possible integer number of nominal sleep clock's that will be loaded into the SLEEP_INTERVAL and WU_TIME registers and (2) a fractional sleep clock that is stored and accumulated in the subsequent catnaps in a variable called "residual tick counter," $R_{TCK}$. Whenever $R_{TCK}$ "overflows" into an integer slow clock, it is reduced back to a fractional sleep clock, while the integer sleep clock is accounted in the SLEEP_INTERVAL register. During the sleep cycle, the subscriber station sleeps only for (SLEEP_INTERVAL+WU_TIME) slow clocks in each catnap which is represented by the duration $T_B$ in FIG. 1 When it is time to wake up at the end of the last catnap, the final contents of $R_{TCK}$ represent the fractional slow clock duration that the subscriber station needs to sleep to make the sleep cycle a multiple of PN roll. This is achieved by programming the CHIPX8_SLEEP_TIME counter with the value of $R_{TCK}$ that makes up for the time $T_C$. The CHIPX8_SLEEP_TIME counter can accommodate a maximum of 3 sleep clock's when the frequency is lowest (≈32 kHz), justifying our effort to keep $R_{TCK}$ under a sleep clock. Since by definition $R_{TCK}$ represents the extra time subscriber station needs to sleep, it is important to make sure that it remains positive.

Sleep computations are done at the constant nominal slow clock frequency, hence there is a need to account for the difference in the nominal and (the real) dynamic slow clock frequencies via the total drift compensation, FDC+DDC of the previous section. In practice, the DDC as computed in Eq. 5 at the end of an access attempt/call is used to initialize a second-order feedback loop that is designed to minimize the calibration error. For subsequent sleep cycles, the DDC is derived from the feedback loop as will be explained below.

1) Before every sleep cycle (t1):
   a) If there enough time to sleep before the next combiner PN roll, divide the sleep duration into multiple catnaps of lengths $C_1, C_2 \ldots C_M$ (i.e., there are M catnaps), such that $T_{SLEEP} = C_1 + C_2 + \ldots C_M$.

2) Before every sleep cycle (t1): Latest frequency drift estimates are obtained:
   a) If (first sleep cycle after end of access/call/analog), initialize the feedback loop with DDC of Eq. 4.
   b) If (not first sleep), update the feedback loop with slew determined in a previous sleep's re-acquisition search. Briefly, following each wakeup, the mobile station searches for signals transmitted from a base station. The timing of signals provided by the base station has a very high accuracy. Accordingly, any error made in a previous estimate of the dynamic frequency (perhaps arising due to trunction effects or temperature or aging-induced frequency drifts) appears as a slew in the timing of the incoming signal. Slew, herein, indicates the timing difference or offset between the timing of signals received from the base station and internal timing within the mobile station after wakeup from a sleep period.
   c) Compute DDC from feedback loop.
3) Before every catnap (t1, t4): Before the first catnap (t1) or upon wake-up on each subsequent catnaps (t4), if the subscriber station is allowed to sleep for the next catnap, the following calibration procedure is undertaken:
   a) If (first catnap): initialize SLEEP_COUNTER and $R_{TCK}$:
   SLEEP_COUNTER ℜ 0
   $R_{TCK}$ ℜ 0
   b) If (second catnap): By now, since subscriber station has already slept for an extra time $T_A$ (which is generally not an integer sleep clock), remove that amount from residual tick counter: $R_{TCK} \leftarrow R_{TCK} - T_A$
   c) Split catnap length $C_m$ into integer and fractional nominal sleep clock's $X_{SC}^N$, $<X>_{SC}^N$ respectively denote the integer and fractional number of nominal sleep clock's in X:
   SLEEP_COUNTER ℜ $C_m$ $_{SC}^N$+SLEEP_COUNTER
   $R_{TCK}$ ℜ $<C_m>_{SC}^N$+$R_{TCK}$
   d) Compensate for the drift:
   SLEEP_COUNTER ℜ $N_{FDC}$+$N_{DDC}$ $SC^N$+SLEEP_COUNTER
   $R_{TCK}$ ℜ $<N_{FDC}+N_{DDC}>_{SC}^N$+$R_{TCK}$
   e) If ($R_{TCK}$ "overflows") into an integer sleep clock, reduce it to a fractional sleep clock and account for the integer portion in the SLEEP_COUNTER register:
   SLEEP_COUNTER ℜ $R_{TCK}$ $SC^N$+SLEEP_COUNTER
   $R_{TCK}$ ℜ $<R_{TCK}>_{SC}^N$
   f) If (residual ticks $R_{TCK}$ is negative): mainly due to the step 3.b, make it positive so that if subscriber station has to wake up in the next catnap, it programs a positive $R_{TCK}$ in the CHIPX8_SLEEP_TIME counter:
   SLEEP_COUNTER ℜ -1+SLEEP_COUNTER
   $R_{TCK}$ ℜ 1+$R_{TCK}$
   g) If (first catnap): before programming for the first catnap (at time t1 of FIG. 3), the value of the extra time $T_A (\approx \_-1\_$ sleep clock's) that subscriber station sleeps is not yet known for use in calibrating the asynchronous sleep clock. If subscriber station has to wake up in the first catnap itself, the residual ticks need to be positive. To be on the safe side, adjust SLEEP_COUNTER and $R_{TCK}$ so as to sleep for two sleep clock's less in the first catnap:
   SLEEP_COUNTER ℜ -2+SLEEP_COUNTER
   $R_{TCK}$ ℜ 2+$R_{TCK}$
   h) Split the resulting catnap length into SLEEP_COUNTER and WU_TIME (a pre-computed constant based on RF warm-up time). In a specific subscriber station logic, the counters count extra over-head clocks in addition to the programmed values, which need to be accounted for. Between catnaps there is also one extra clock of overhead required by the state-machine to change state to enter sleep again:
   SSLEEP_COUNTER ← SLEEP_COUNTER - WARMUP_TIME
   SSLEEP_COUNTER ← SLEEP_COUNTER - OVERHEAD-1
4) Time to wake up (t7): In the last catnap, as the WU_TIME is counting down, the following computations are done:
   a) If (first catnap): If subscriber station is required to wake-up after the first catnap (see 3.g), the control does not get to 3.b where an adjustment is made for $T_A$. So the time $T_A$ is accounted for in the residual ticks as: $R_{TCK} \leftarrow R_{TCK} - T_A$. The operation 3.g ensures that $R_{TCK}$ is positive.
   b) The CHIPX8_SLEEP_TIME is loaded with $R_{TCK}$ (in chipx8's) and counted down at chipx8, to eventually wake up the subscriber station.
5) Re-acquisition upon wake up (t10):
   a) The preceding calibration process ensures that the subscriber station sleeps for an integer number of PN rolls with very high accuracy (depends on the drift estimation). Consequently, the searcher should find the pilot with minimal offset relative to its position before sleep. Any error in the drift compensation shows up as "re-acquisition slew".
   b) The re-acquisition slew is stored to be used later in the next sleep cycle to run the feedback loop to modify or correct the DDC as will be shown in the next section.

As noted above, the FEE is initially used to estimate the manufacturer specific sleep crystal's frequency $F_{SC}^A$ from which the nominal frequency $F_{SC}^N$ is derived. After the initial frequency estimation, if the subscriber station goes to the access/traffic channels/AMPS system, its internal temperature could increase considerably resulting in the dynamic frequency $F_{SC}^D$ to differ from its initial estimate. To handle this situation, the FEE is used to estimate the dynamic frequency drift every time the unit returns to the slotted-paging mode.

However, this "one time" estimation of the dynamic drift at the beginning of slotted mode is not typically sufficient since the change in the frequency may occur over several sleep cycles as the unit cools off to its ambient temperature. Furthermore, changes in ambient temperature occur as well.

It can be shown that a given error made in the drift compensation of the calibration results in a proportional pilot-drift (or re-acquisition slew) on wake-up. For example, if the subscriber station had to sleep for τ chipx8's and a calibration error resulted in only (τ−δ) chipx8's worth of sleep, the searcher will see the pilot drift by δ chipx8's upon wake-up. This fact is utilized in setting up a feedback loop that adaptively modifies the dynamic drift compensation (DDC) to minimize any error.

Figure 5:
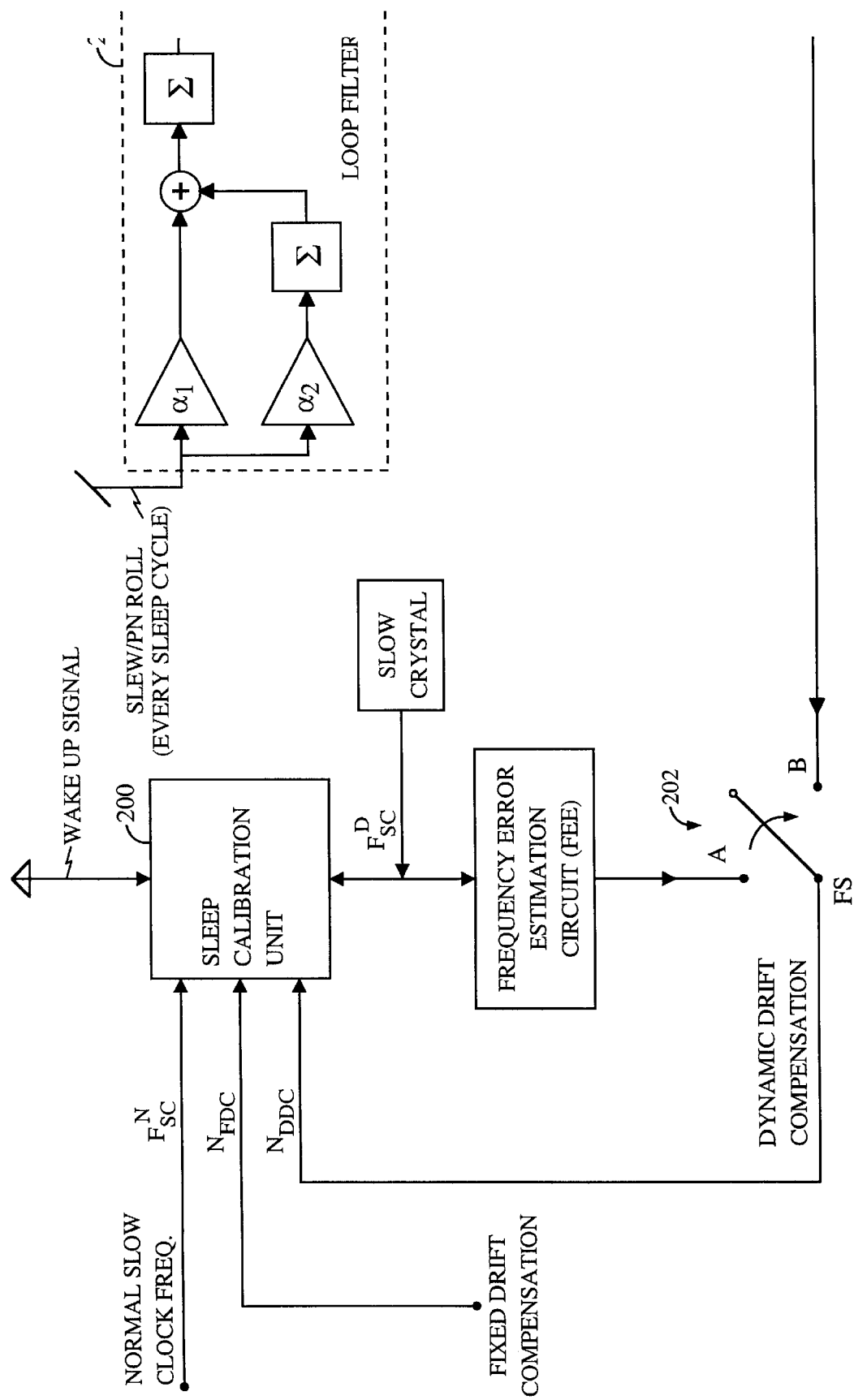
FIG. 5 is a block diagram illustrating a feedback loop employed by the exemplary method of the invention to estimate frequency drift.

FIG. 5 is a functional block diagram of the feedback loop. The calibration process described above is performed by a sleep calibration unit 200, which accepts the following four external inputs:

1. Slow crystal's dynamic frequency $F_{SC}^D$, which is to be tracked,
2. Nominal slow clock frequency $F_{SC}^N$, a constant after the power-up estimation,
3. Fixed drift compensation $N_{FDC}$, a constant after power-up estimation, and
4. Dynamic drift compensation $N_{DDC}$, which is the tracking variable.

The sleep calibration unit employs these values in the sleep calculation equations described above to determine when to wake up other components of the mobile station for receiving paging signals or for handling other required tasks. As part of the sleep calculations, the sleep calibration unit counts cycles of the slow sleep clock during sleep periods. The sleep calibration unit eventually outputs a wake up signal that is used by other components of the mobile station.

The sleep calibration unit is employed with a feedback loop provided to compensate for drift in the slow clock crystal frequency so that the wake up signal is issued in synchronization with paging signals issued by the base station to minimize pilot reacquisition time. Hence, the aim of the feedback mechanism is to use $F_{SC}^N$, $N_{FDC}$, $N_{DDC}$ to derive an adjusted value for $N_{DDC}$ ( used in the sleep calculations described above) to compensate for changes in the slow crystal frequency $F_{SC}^D$.

FIG. 5 also shows a conceptual flip-switch (FS) 202 that determines the source of $N_{DDC}$. Every time the subscriber station leaves the slotted-paging mode (due to reasons detailed above) the switch is set to position 'A'. Consequently, the FEE supplies the initial estimate of the dynamic drift once the station comes back to the slotted-paging mode. After thus initializing the loop, the switch is moved to position 'B' and stays there as long as the unit is in slotted-paging mode. While in position B, a loop filter 204 supplies a corrected estimate of $N_{DDC}$.

At each paging slot, the mobile station performs a pilot re-acquisition process to reacquire the pilot signal from the nearest base station. Once the pilot is reacquired, a precise timing value is received from the base station representative of the true time. As noted above, any offset between the timing values provided by the base station and timing values as determined within the mobile station is slew. The amount of slew is determined based upon a comparison of the respective timing signals of the mobile station and the base station. The slew is evaluated as a slew per PN roll. A signal representative of the slew per PN roll is applied to the feedback loop filter every sleep cycle. The loop filter calculates an adjusted value for the $N_{DDC}$ based upon the current value of the slew/PN roll and from predetermined loop values described below. The adjusted value of $N_{DDC}$ is then applied to the SLEEP_COUNTER as described above in section 3.d to compensate for any drift in the sleep mode clock. Note that the value for $N_{DDC}$ is not applied directly to the loop filter. Rather, only the current value of the slew is applied. Nevertheless, with proper selection of the predetermined values used in the loop filter, the filter outputs an adjusted value of $N_{DDC}$. The adjusted value is determined by the loop filter so that the amount of slew in the next pilot reacquisition cycle should be less than before. With repeated iterations, $N_{DDC}$ converges on a substantially fixed numeric value having a value sized to ensure that the slew is near zero. Iterative reduction of the slew to near zero typically occurs very quickly following the re-entry of the mobile station into the slotted-paging mode. Thereafter, the feedback loop provides any slight adjustments to $N_{DDC}$ to maintain the slew near zero. In this manner, the wake up signal output by the sleep calibration unit remains substantially in synch with paging slots of the base station so that pilot reacquisition time is minimized.

The appropriate values for use in the feedback loop to reduce the slew to near zero and to maintain it near zero depend upon the particular characteristics of the mobile station, the sleep clock and the overall wireless system and are determined, for each particular embodiment, via routine experiments or other conventional techniques. Also, the choice of the order of the loop filter is dependent on the type of input frequency transient that needs to be tracked. If the slow crystal only has a constant frequency uncertainty, a first order loop is sufficient to track the constant frequency offset. However, in practice the frequency transient has a parabolic shape which makes a second or third order loop filter more desirable. For small slot-cycle-indices most often used in practice (SCI=0,1,2), the frequency transient is approximated very well by a simple ramp function, which is tracked with minimal steady state error by a second order loop.

If the loop is iterated every sleep duration with the slew $S \leftarrow \rightarrow T_{SLEEP}$ seen in that sleep duration, the sampled loop gains ($á_1$, $á_2$) can be expressed in terms of the loop noise band-width $B_L$ and damping ratio $\zeta$ of an equivalent continuous time feedback loop given by:

$$á_1 = 2\zeta \cdot \sqrt{á_2} + á_2/2$$

where $$á_2 = \frac{-4 \cdot B_L}{2\zeta + \frac{1}{(2\zeta)}} \sqrt{\leftrightarrow T_{SLEEP}^2} \quad \text{Eq. 5}$$

where $B_L$ and $\zeta$ can be chosen according to the input signal and noise characteristics. The "noise" in the loop arises due to the fluctuations in the pilot position in a multi-path and fading environment.

The expressions for the sampled loop gains given in Eq. 5 are valid under the assumption that the loop is uniformly sampled, i.e., if and only if the loop iteration interval $T_{SLEEP}$ remains constant. For a given SCI, the sleep duration can be expressed as: $T_{SLEEP} = 2^{SCI} \leftarrow \rightarrow 1.28 - T_{ACTIVE}$, where $T_{ACTIVE}$ is the time spent by subscriber station demodulating the paging channel when it is awake. Since $T_{ACTIVE}$ depends on the length of the paging channel messages, there is no guarantee for some implementations that $T_{SLEEP}$ is a constant. Consequently, for those implementations, because the loop is non-uniformly updated in time, the continuous time feedback loop approximation to a sampled loop that gave rise to Eq. 9 may require adjustment.

Although the sleep cycle duration varies randomly varying, it is at substantially least guaranteed to be a multiple of PN roll. This fact is exploited to formulate a loop configuration with a frequency error defined as slew/PN roll ($S \leftarrow \rightarrow T_{PN}$) instead of the slew/sleep cycle ($S \leftarrow \rightarrow T_{SLEEP}$) and update the loop filter at sleep cycle length $T_{SLEEP}$. For implementations where the sleep cycle is only a PN roll long, the loop gains can be expressed as:

$$á_1 = 2\zeta \cdot \sqrt{á_2} + á_2/2$$

where, $$\acute{a}_2 = \frac{-4 \cdot B_L}{\left(2æ + \frac{1}{2æ}\right)} \sqrt{\leftrightarrow (T_{PN})^2} \quad \text{Eq. 6}$$

The loop gains so computed for a single PN roll sleep cycles can be used for other sleep lengths $T_{SLEEP}$ while keeping in mind that the effective loop noise band-width is no longer $B_L$ and is dependent on the SCI.

Table I provides a summary of the various variables employed in connection with the above descriptions.

| Variable | Definition | Comments | Value |
|---|---|---|---|
| $F_{SC}$ | Frequency range of Slow Crystal (sleep clock) | | 30–60 kHz or 1.92 to 3.84 MHz |
| $F_{CX8}$ | Frequency of CHIPX8 clock | 8*1.2288 MHz | 9.8304 MHz |
| $T_{PN}$ | Duration of a PN roll | | 26.67 ms |
| $T_A$ | Time needed to calibrate the asynchronous Slow clock | | _–1_sleep clock |
| $T_B$ | Time slept during catnaps | | Integer PN rolls |
| $T_C$ | Residual time needed to make sleep length a multiple of PN roll | | Fractional sleep clock |
| $T_{SLEEP}$ | Sleep cycle duration | $T_A + T_B + T_C$ | Integer PN rolls |
| $F_{SC}^A$ | Actual frequency of sleep clock | Phone Manufacturer specific | E.g. 32.76 kHz |
| $F_{SC}^N$ | Nominal frequency of sleep clock | Computational convenience (Eq. 2) | 32.7 kHz |
| $F_{SC}^D$ | Dynamic frequency of sleep clock | Temperature dependent | E.g. 32.0 kHz |
| $F_{SC}^{D-E}$ | Estimated dynamic frequency of sleep clock | Estimated by feedback loop | |
| $N_{SC}^A$ | No of chipx8's in actual sleep clock | $F_{CX8}/F_{SC}^A$ | E.g. 300.073 chipx8/sleep clock |
| $L^{FEE}$ | No of sleep clock counted by FEE | | 255 sleep clock's |
| $L^{MAW}$ | Length of the MAW filter | Design choice | 256 FEE's |
| $N_{FEE}^{MAW}$ | The output of the MAW filter operating on the $L^{FEE}$ FEE outputs | | |
| $F_{TC}$ | Actual frequency of TC | $F_{CX8}/2$ | 4.1952 MHz |
| $F_{TC}^N$ | Nominal frequency of TC | Defined to perform high precision computations with a low frequency clock. Eq. 3 | E.g. 4.905 MHz |
| $N_{FDC}$ | Fixed Drift Compensation (FDC) | To compensate for fixed difference $(F_{SC}^A - F_{SC}^N)$ | |
| $N_{DDC}$ | Dynamic Drift Compensation (DDC) | To compensate for dynamic difference $(F_{SC}^D - F_{SC}^A)$ | |
| $R_{TCK}$ | Residual tick counter | Accumulates fractional sleep clock's from all catnaps. | Positive and less than a sleep clock. |
| $C_m$ | Length of the $m^{th}$ catnap | | Integer PN rolls |
| $\Delta F_{SC}^D$ | Error in feedback loop estimate | $F_{SC}^D - F_{SC}^{D-E}$ | |
| S | Reacquisition slew/sec seen at the end of a sleep cycle | Proportional to error $\Delta F_{SC}^D$ | |
| $(\acute{a}_1, \acute{a}_2)$ | Loop filter gains of the digital loop | | |
| $(B_L, \zeta)$ | Loop noise bandwidth and damping ratio of an equivalent continuous loop | | |
| SCI | Slot Cycle Index | IS-95 A Standard | 0 through 7 |

The exemplary embodiments have been primarily described with reference to block diagrams and flow charts illustrating pertinent features of the embodiments. As the flow charts, each step therein represents both a method step and an apparatus element for implementing the method step. The apparatus element may represent a means for implementing the method step, an apparatus for implementing the method step or other structural element for implementing the method step. It should be appreciated that not all components of a complete implementation of a practical system are necessarily illustrated or described in detail. Rather, only those components necessary for a thorough understanding of the invention have been illustrated and described. Actual implementations may contain more components or, depending upon the implementation, fewer components. The description of the exemplary embodiments is provided to enable any person skilled in the art to make or use the present invention. Various modifications to these embodiments will be readily apparent to those skilled in the art and the generic principles defined herein may be applied to other embodiments without the use of the inventive faculty. Thus, the invention is not intended to be limited to the embodiments shown herein but is to be accorded the widest scope consistent with the principles and novel features disclosed herein.

What is claimed:

1. A method for tracking the length of a sleep period within a mobile station using a sleep clock, said method comprising the steps of:
   initiating a sleep period subdivided into a sequence of sub-periods each of known duration wherein the durations of the sub-periods are not necessarily integer multiples of cycles of the sleep clock;
   tracking the elapsed time within each individual sub-period of the sleep period using an integer sleep counter which tracks whole cycles of the sleep clock; and
   tracking any remaining fractional portions of the cycles of the sleep mode clock not accounted for by the integer sleep counter using a fractional sleep counter, said fractional sleep counter accumulating remaining fractional portions of sleep mode cycles from one sub-period to the next.

2. The method of claim 1 wherein, within each sub-period, the integer sleep counter is incremented downwardly on each cycle of the sleep clock and wherein, when the integer sleep counter reaches zero, the sub-period is deemed to be complete.

3. The method of claim 1 wherein, when a sub-period is deemed to be complete, a keypad of the mobile station is checked to determine whether a key has been pressed and, if a key has been pressed, the sleep period is terminated.

4. The method of claim 2 wherein at the beginning of a first sub-period the fractional sleep counter and the integer sleep counter are both set to zero.

5. The method of claim 2 wherein a number of cycles of the sleep clock corresponding to the known duration of each sub-sleep period is determined and wherein, within each respective sub-period:

a current value of the integer sleep counter is increased by an integer portion of the number of cycles of the sleep clock determined to correspond to the known duration of the respective sub-period such that the integer counter tracks the approximate duration of the respective sub-period; and a current value of the fractional sleep counter is increased by a fractional portion of the number of cycles of the sleep clock determined to correspond to the known duration of the respective sub-sleep period such that fractional portions of the respective sub-period are accumulated along with previous fractional portions from previous sub-periods, if any.

6. The method of claim 2 wherein a number of cycles of the sleep clock corresponding to a predetermined amount of frequency drift occurring within each sub-period period is determined and wherein for each respective sub-period:

a current value of the integer sleep counter is adjusted by an integer portion of the number of cycles of the sleep clock determined to correspond to the predetermined frequency drift occurring within the respective sub-period such that the integer counter compensates approximately for the frequency drift; and a current value of the fractional sleep counter is adjusted by a fractional portion of the number of cycles of the sleep clock determined to correspond to the predetermined frequency drift occurring within the respective sub-period such that fractional portions of the frequency drift for the respective sub-period are accumulated along with previous fractional portions from previous sub-periods, if any.

7. The method of claim 4 further including the step of determining, prior to the initiation of the sleep period, an amount of frequency drift expected in the sleep clock for each sub-period of the sleep period.

8. The method of claim 2 wherein, whenever the fractional sleep counter overflows:

a current value of the integer sleep counter is increased by an integer overflow portion of the fractional sleep counter such that the integer counter accounts for the overflow; and a current value of the fractional sleep counter is reset to equal only the remaining fractional portion, if any, of the previous fractional sleep counter value such that the fractional sleep counter continues to track any remaining fractional portions of cycles of the sleep mode clock.

9. The method of claim 2 wherein a first sub-period begins some time following the beginning of the sleep period and wherein at the beginning of a second sub-period the fractional sleep counter is decreased by an amount necessary to compensate for the time period between the beginning of the sleep period and the beginning of the first sub-period.

10. The method of claim 9 wherein, whenever the fractional sleep counter is below zero:

a current value of the integer sleep counter is reduced by one; and a current value of the fractional sleep counter is increased by one.

11. The method of claim 2 wherein, during each respective sub-period of the sleep period:

a current value of the integer sleep counter is reduced by an integer portion of a predetermined wakeup period duration value such that the integer sleep counter expires before the end of each sub-period to leave sufficient time to permit components of the mobile station to be powered up by the end of the sub-period.

12. The method of claim 2 wherein, following a final sub-period, a transition mode clock counter having a frequency substantially greater than that of the sleep clock is activated to track any remaining time represented by the fractional sleep counter such that any remaining portions of the sleep period are tracked.

13. The method of claim 12 wherein a first sub-period begins some time following the beginning of the sleep period and wherein, if the first sub-period of the sleep period is also the final sub-period, the fractional sleep counter is decreased by an amount necessary to compensate for the time period between the beginning of the sleep period and the beginning of the first sub-period prior to activation of the transition mode clock.

14. A device for tracking the length of a sleep period within a mobile station using a sleep clock, said device comprising:

means for initiating a sleep period subdivided into a sequence of sub-periods each of known duration wherein the durations of the sub-periods are not necessarily integer multiples of cycles of the sleep clock;

means for tracking the elapsed time within each individual sub-period of the sleep period using an integer sleep counter which tracks whole cycles of the sleep clock; and means for tracking any remaining fractional portions of the cycles of the sleep mode clock not accounted for by the integer sleep counter using a fractional sleep counter, said fractional sleep counter accumulating fractional portions of sleep mode cycles from one sub-period to the next.

15. The device of claim 14 wherein, within each sub-period, the integer sleep counter is incremented downwardly on each cycle of the sleep clock and wherein, when the integer sleep counter reaches zero, the sub-period is deemed to be complete.

16. The device of claim 14 further including means, operative when a sub-period is deemed complete, for determining whether a key has been pressed on a keypad of the mobile station and, if a pressed key is detected, for terminating the sleep period.

17. The device of claim 14 wherein at the beginning of a first sub-period of the sleep period the fractional sleep counter and the integer sleep counter are both set to zero.

18. The device of claim 15 further including means for determining a number of cycles of the sleep clock corresponding to the known duration of each sub-sleep period; and means, operative during each respective sub-period, for increasing a current value of the integer sleep counter by an integer portion of the number of cycles of the sleep clock determined to correspond to the known duration of the respective sub-period such that the integer counter approximately tracks the duration of the respective sub-period; and increasing a current value of the fractional sleep counter is by a fractional portion of the number of cycles of the sleep clock determined to correspond to the known duration of the respective sub-period such that fractional portions of the respective sub-period are accumulated along with fractional portions from previous sub-periods, if any.

19. The device of claim 15 further including means for determining a number of cycles of the sleep clock corresponding to a predetermined amount of frequency drift occurring within each sub-period period; and means, operative during each respective sub-period, for adjusting a current value of the integer sleep counter by an integer portion of the number of cycles of the sleep clock determined to correspond to the predetermined frequency drift occurring within the respective sub-period such that the integer counter compensates approximately for the frequency drift; and adjusting a current value of the fractional sleep counter by a fractional portion of the number of cycles of the sleep clock determined to correspond to the predetermined frequency drift occurring within the respective sub-period such that fractional portions of the frequency drift value are accumulated along with fractional portions from previous sub-periods, if any.

20. The device of claim 19 further including means for determining a frequency drift value for the sleep clock prior to the initiation of the sleep period.

21. The device of claim 15 further including means, operative whenever the fractional sleep counter overflows, for increasing a current value of the integer sleep counter by an integer overflow portion of the fractional sleep counter such that the integer counter accounts for the overflow; and resetting a current value of the fractional sleep counter to equal only the remaining fractional portion, if any, of the previous frequency sleep counter value such that the fractional sleep counter continues to track any remaining fractional portions of cycles of the sleep mode clock.

22. The device of claim 15 wherein the means for initiating the sleep period operates to initiate a first sub-period some time following the beginning of the sleep period and wherein the device further includes means, operative during a second sub-period of the sleep period, for increasing the fractional sleep counter by an amount necessary to compensate for the time period between the beginning of the sleep period and the beginning of the first sub-period.

23. The device of claim 22 further including means, operative whenever the fractional sleep counter is less than zero, for decreasing a current value of the integer sleep counter by one; and increasing a current value of the fractional sleep counter by one.

24. The device of claim 15 further including means, operative during each respective sub-period of the sleep period, for decreasing a current value of the integer sleep counter by an integer portion of a predetermined wakeup period duration value such that the integer sleep counter expires before the end of each sub-period to leave sufficient time to permit components of the mobile station to be powered up by the end of the sub-period.

25. The device of claim 15 further including means, operative following a final sub-period, for activating a transition mode clock counter having a frequency substantially greater than that of the sleep clock to track any remaining time represented by the fractional sleep counter such that any remaining fractional portions of the sleep period are tracked.

26. The device of claim 25 wherein the means for initiating the sleep period operates to initiate a first sub-period some time following the beginning of the sleep period and wherein the device further includes means, operative if the first sub-period of the sleep period is also the final sub-period, for increasing the fractional sleep counter by an amount necessary to compensate for the time period between the beginning of the sleep period and the beginning of the first sub-period prior to activation of the transition mode clock.

27. A device for tracking the length of a sleep period within a mobile station using a sleep clock, said device comprising:

a sleep mode activation unit for initiating a sleep period subdivided into a sequence of sub-periods each of known duration wherein the durations of the sub-periods are not necessarily integer multiples of cycles of the sleep clock;

an integer sleep counter for tracking the elapsed time within each individual sub-period of the sleep period, said integer sleep counter tracking whole cycles of the sleep clock; and a fractional sleep counter for tracking any remaining fractional portions of the cycles of the sleep mode clock not accounted for by the integer sleep counter, said fractional sleep counter accumulating fractional portions of sleep mode cycles from one sub-period to the next.

28. A method for compensating for frequency drift with in a sleep clock signal used during a slotted paging mode of operation of a wireless mobile station, said mobile station in periodic communication with a base station providing timing signals, said method comprising the steps of:

determining an initial frequency of the sleep clock signal following power-up of the mobile station;

determining a fixed frequency drift compensation factor representative of a difference between the initial frequency of the sleep clock signal and a pre-determined nominal frequency;

estimating a dynamic frequency error compensation factor representative of a difference between the initial frequency and a current frequency of the sleepclock signal; and iteratively updating the dynamic frequency error compensation factor during the slotted mode of operation by determining an amount of timing slew between the mobile station and the base station, and then determining new values for the dynamic frequency compensation factor by applying a value representative of the amount of the slew to a feedback loop configured to provide a new dynamic frequency error compensation factor having a value selected to achieve a subsequent reduction in slew.

29. The method of claim 28 wherein the step of determining the nominal frequency of the sleep clock signal is performed once following each power-up of the mobile station.

30. The method of claim 28 wherein the step of estimating the dynamic frequency compensation factor is performed once for each entry into the slotted mode of operation.

31. The method of claim 28 wherein the step of determining a new value for the dynamic frequency compensation factor is performed once each cycle of the sleep clock signal.

32. The method of claim 28 wherein the feedback loop includes a loop filter represented by:

$$á_1=2æ.\sqrt{á_2}+á_2/2$$

where, $$á_2 = \frac{-4.B_L}{2æ+\frac{1}{(2æ)}}\sqrt{\leftrightarrow T_{SLEEP}^2}$$

wherein $B_L$ is a predetermined loop noise bandwidth value, $\zeta$ is a predetermined damping ratio and $T_{SLEEP}$ is the length of a sleep period.

33. The method of claim 28 wherein the feedback loop includes a loop filter represented by:

$$á_1=2æ.\sqrt{á_2}+á_2/2$$

where, $$á_2 = \frac{-4.B_L}{\left(2æ+\frac{1}{2æ}\right)}\sqrt{\leftrightarrow (T_{PN})^2}$$

wherein $B_L$ is a predetermined loop noise bandwidth value, $\zeta$ is a predetermined damping ratio and wherein a length of the sleep period is a multiple of $T_{PN}$ which is a predetermined time period.

34. The method of claim 28 wherein the order of the loop filter is selected based upon a degree of uncertainty in the frequency of the sleep clock signal.

35. The method of claim 34 wherein the frequency of the sleep clock signal is constant and wherein a first order loop in employed.

36. The method of claim 34 wherein an uncertainty in the sleep clock signal is represented by a parabolic function and wherein the loop is at least a second order loop.

37. The method of claim 28 wherein the wireless mobile station is configured to operate in both the slotted paging mode and within an AMPS mode and wherein a frequency error estimation circuit is employed to estimate a new value for the dynamic frequency error compensation factor subsequent to each transition from the AMPS mode to the slotted paging mode.

38. The method of claim 28 wherein the slew is determined by periodically receiving timing signals from the base station and comparing the timing signal from the base station with timing signal generated within the mobile station.

39. A device for compensating for frequency drift within a sleep clock signal used during a slotted paging mode of operation of a wireless mobile station, said mobile station in periodic communication with a base station providing timing signals, said device comprising:

means for determining an initial frequency of the sleep clock signal following power-up of the mobile station;

means for determining a fixed frequency drift compensation factor representative of a difference between the initial frequency of the sleep clock signal and a predetermined nominal frequency;

means for estimating a dynamic frequency error compensation factor representative of a difference between the initial frequency and a current frequency of the sleep clock signal; and means, operative during the slotted mode of operation, for iteratively updating the dynamic frequency error compensation factor by determining an amount of timing slew between the mobile station and the base station, and then determining new values for the dynamic frequency compensation factor by applying a value representative of the amount of the slew to a feedback loop configured to provide a new dynamic frequency error compensation factor having a value selected to achieve a subsequent reduction in slew.

40. The device of claim 39 wherein the means for determining the nominal frequency of the sleep clock signal operates once following each power-up of the mobile station.

41. The device of claim 39 wherein the means for estimating the dynamic frequency compensation factor operates once for each entry into the slotted mode of operation.

42. The device of claim 39 wherein the means for determining an amount of slew in the sleep clock signal and for then determining a new value for the dynamic frequency compensation factor operates once each cycle of the sleep clock signal.

43. The device of claim 39 wherein the loop filter is represented by:

$$á_1=2æ.\sqrt{á_2}+á_2/2$$

where $$á_2=(4.B_L-1)\leftarrow\rightarrow(T_{SLEEP})^2$$

wherein $B_L$ is a predetermined loop noise bandwidth value, $\zeta$ is a predetermined damping ratio and $T_{SLEEP}$ is the length of a sleep period.

44. The device of claim 39 wherein the loop filter is represented by:

$$á_1=2æ.\sqrt{á_2}+á_2/2$$

where, $$á_2=(4.B_L-1)\leftarrow\rightarrow(T_{PN})^2$$

wherein $B_L$ is a predetermined loop noise bandwidth value, $\zeta$ is a predetermined damping ratio and wherein a length of the sleep period is a multiple of $T_{PN}$ which is a predetermined time period.

45. A device for compensating for frequency drift within a sleep clock signal used during a slotted paging mode of operation of a wireless mobile station, said mobile station in periodic communication with a base station providing timing signals, said device comprising:

an initial frequency determination unit;

a fixed frequency drift compensation factor determination unit;

a dynamic frequency error compensation factor determination unit; and a feed back unit, operative during the slotted mode of operation, for iteratively updating the dynamic frequency error compensation factor by determining an amount of timing slew between the mobile station and the base station, and then determining new values for the dynamic frequency compensation factor by applying a value representative of the amount of the slew to a feedback loop configured to provide a new dynamic frequency error compensation factor having a value selected to achieve a subsequent reduction in slew.

* * * * *